US007261982B2

(12) United States Patent
Fondeur et al.

(10) Patent No.: US 7,261,982 B2
(45) Date of Patent: Aug. 28, 2007

(54) PLANAR CIRCUIT OPTIMIZATION

(75) Inventors: Barthelemy Fondeur, Mountain View, CA (US); Anca L. Sala, Sunnyvale, CA (US); Robert J. Brainard, Sunnyvale, CA (US); David K. Nakamoto, San Jose, CA (US); Tom Truong, San Jose, CA (US); Sanjay M. Thekdi, Santa Clara, CA (US); Anantharaman Vaidyanathan, San Jose, CA (US)

(73) Assignee: JDS Uniphase Corporation, Milpitas, CA (US)

( * ) Notice: Subject to any disclaimer, the term of this patent is extended or adjusted under 35 U.S.C. 154(b) by 521 days.

(21) Appl. No.: 10/736,295

(22) Filed: Dec. 15, 2003

(65) Prior Publication Data
US 2005/0031968 A1 Feb. 10, 2005

Related U.S. Application Data

(60) Provisional application No. 60/493,395, filed on Aug. 7, 2003.

(51) Int. Cl.
*G03F 1/00* (2006.01)
*G03C 5/00* (2006.01)
(52) U.S. Cl. .......................................... 430/5; 430/394
(58) Field of Classification Search .................... 430/5, 430/321, 394; 385/14
See application file for complete search history.

(56) References Cited

U.S. PATENT DOCUMENTS 6,204,912 B1   3/2001  Tsuchiya et al. ............. 355/53
6,479,194 B1   11/2002 Talor ............................. 430/5
6,492,073 B1   12/2002 Lin et al. ....................... 430/5
6,517,997 B1*  2/2003  Roberts ...................... 430/322
6,526,203 B1   2/2003  Gonzalez et al. ............. 385/37
6,563,997 B1   5/2003  Wu et al. ..................... 385/130
6,597,841 B1   7/2003  Dingel ......................... 385/37
6,818,389 B2*  11/2004 Fritze et al. ................ 430/394
7,082,596 B2*  7/2006  Liu ............................. 716/19
2002/0160281 A1  10/2002 Subramanian et al. ......... 430/5
2003/0143468 A1  7/2003  Cauchi ........................... 430/5

FOREIGN PATENT DOCUMENTS

WO    WO 03/042759 A2    5/2003

* cited by examiner

*Primary Examiner*—S. Rosasco
(74) *Attorney, Agent, or Firm*—Allen, Dyer, Doppelt, Milbrath & Gilchrist, P.A.

(57) ABSTRACT

The present application relates to a method of fabricating planar circuits using a photo lithographic mask set, to the photo lithographic mask set, and to a planar circuit fabricated with the photo lithographic mask set. The instant invention involves separating a photo lithographic mask into two parts, namely, a master mask and one or more slave masks. The master mask and the one or more slave masks form a photo lithographic mask set that is used iteratively to fabricate the planar circuits. In particular, the master mask is used as a template to provide the general layout for the planar circuit, while each slave mask is varied to tune and/or tailor the planar circuit. Since only a small portion of the planar circuit is redesigned and/or rewritten as a new mask (i.e., the slave mask), the instant invention provides a simple and cost effective method for optimizing planar circuits. Furthermore, since most mask errors will originate from the master mask, the instant invention provides an efficient method of correcting errors on planar circuits using the one or more slave masks.

24 Claims, 10 Drawing Sheets

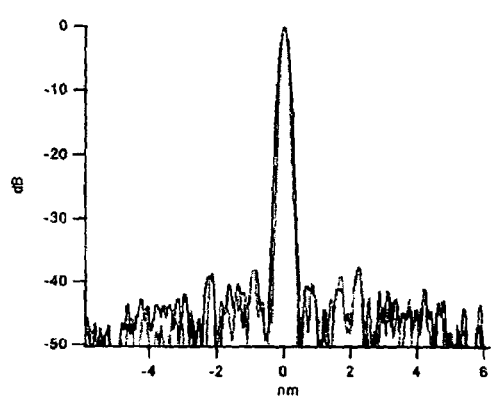 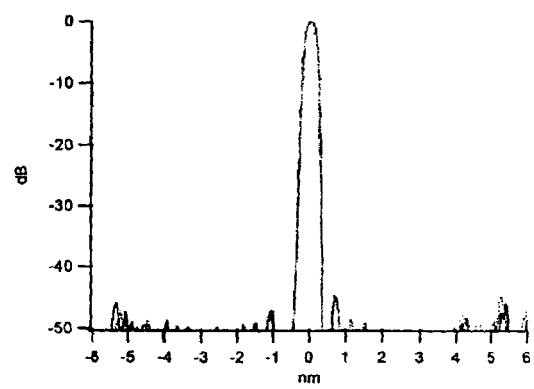
FIG. 14A  FIG. 14B

PLANAR CIRCUIT OPTIMIZATION

CROSS-REFERENCE TO RELATED APPLICATIONS

This application claims priority from U.S. provisional application No. 60/493,395 filed Aug. 7, 2003, which is incorporated herein by reference for all purposes.

MICROFICHE APPENDIX

Not Applicable.

TECHNICAL FIELD

The present application relates generally to planar circuits, and in particular, to the fabrication and optimization of planar lightwave circuits using a photo lithographic mask, or mask set.

BACKGROUND OF THE INVENTION

Planar lightwave circuits (PLCs) make up the fundamental building blocks for the newly emerging, modern fiber optic communications infrastructure. They are innovative devices configured to transmit light in a manner analogous to the transmission of electrical currents in electronic integrated circuit devices. One example of a PLC is an arrayed wave guide grating (AWG). Other examples of PLCs include integrated wavelength multiplexers/demultiplexers, optical switches (OSs), variable optical attenuators (VOAs), and/or taps.

A planar lightwave circuit (PLC) is typically fabricated by forming one or more embedded optical waveguides on a semiconductor substrate, such as silicon wafer. The wave guide(s) are traditionally formed by growing a bottom clad layer, such as undoped silica, over the wafer and subsequently depositing an optical core layer, such as doped silica which has a higher refractive index than the undoped silica, over the bottom clad layer. The optical core layer is then patterned using well-known photolithography techniques and etched to define the wave guide core(s). Subsequently, a top cladding layer is deposited over the wave guide cores. Finally, the wafer is cut into multiple planar lightwave circuit dies. These chips are then packaged according to their particular applications.

Notably, the photo lithographic techniques used to prepare PLCs have been largely borrowed from photo lithographic technology used to prepare electronic integrated circuits. For example, to pattern the optical core layer as discussed above, a photoresist layer, which may be a positive or negative photoresist, is typically deposited on the optical core layer. A photo lithographic mask is then used to expose specific regions of the photoresist to define the features being formed on the substrate. Multiple exposures over different areas of the substrate generally occur. After the exposure(s), the substrate is processed such the features are deposited onto or etched from the substrate.

Unfortunately, the photo lithographic fabrication of PLCs includes some considerations that are not addressed in the photo lithographic fabrication of electronic integrated circuits.

The first consideration relates to the fact that the length and shape of an optical wave guide plays a much more significant role in the proper functioning of a PLC than the length and shape of an electrical conductor in an electronic integrated circuit. In particular, the length of waveguides, the path difference between waveguides, the separation between waveguides, and/or the radius of curvature in waveguides significantly affects the optical response of a PLC. Accordingly, any errors present in the photo lithographic mask, including its finite resolution, will produce various unpredictable errors that are systematically replicated during the rest of the process. Moreover, errors in the transfer of the mask pattern to the photoresist will produce various other errors. The usual method of correcting mask or design errors is to design a full new photo lithographic mask that compensates for the errors of the previous mask. Unfortunately, redesigning a full new mask is expensive and time consuming. Furthermore, the new mask may also introduce errors and/or design issues. An alternative method for correcting mask or design errors includes using a post-processing technique, such as UV trimming, inserting a correcting wave-plate, and/or heat tuning. Unfortunately, these alternative methods also have very high costs since they are done on a chip-to-chip basis after the chips are processed, diced, and measured.

A second consideration relates to the continuous need for enhanced functionality in PLCs. For example, it is common for multiple functions to be integrated monolithically on a single chip. However, as the chips get larger and include more functions working together, correcting mask errors and/or optimizing the chip requires a large number of design iterations, leading to the fabrication of many masks, long lead times, and high costs.

A third consideration relates to the fact that the optical properties of PLCs are not typically uniform over the entire wafer. In these instances, a chip produced from a first part of a wafer will have certain response at a particular wavelength, while a chip produced from a second part of the wafer will have a different response at the same wavelength, even when they are both produced with the same photo lithographic mask(s) and are processed together.

It is an object of the instant invention to provide a less costly and time consuming method for correcting errors on and/or optimizing PLCs.

It is another object of the instant invention to provide a photo lithographic method of fabricating PLCs that takes into account different wafer positions.

SUMMARY OF THE INVENTION

The instant invention relates to a method of fabricating PLCs using a photo lithographic mask set, to the photo lithographic mask set, and to a PLC fabricated with the photo lithographic mask set.

In particular, the instant invention relates to a photo lithographic mask that is separated into two parts, namely, a master mask and one or more slave masks. The master mask and the one or more slave masks form the photo lithographic mask set that is used iteratively to fabricate PLCs. For example, the master mask is used as a template to provide the general layout for the PLC, while each slave mask is varied to tune and/or tailor the PLC. Since only a small portion of the PLC is redesigned and/or rewritten as a new mask (i.e., the slave mask), the instant invention provides a simple and cost effective method for optimizing PLCs. Furthermore, since most mask errors will originate from the master mask, the instant invention provides an efficient method of correcting errors on PLCs using the slave mask(s).

While the instant invention is applicable to PLCs, such as the AWGs discussed above, it is also applicable to other types of planar circuits. In particular, it is applicable to PLCs including integrated wavelength multiplexers/demultiplexers, optical switches (OSs), variable optical attenuators (VOAs), and/or taps.

Accordingly, one aspect of the instant invention provides a photo lithographic mask set comprising: a master mask including a first pattern having features for forming part of a planar circuit, the first pattern including a featureless region disposed therein such that the planar circuit is incomplete; and, a slave mask including a second pattern having features for completing the planar circuit.

In accordance with another aspect of the instant invention there is provided a method of fabricating a planar circuit utilizing a photo lithographic mask set, the method comprising the steps of: (a) providing a photo lithographic mask set including a master mask and a slave mask, the master mask including a first pattern having features for forming part of the planar circuit and including a featureless region disposed within the first pattern such that the planar circuit is incomplete, the slave mask including a second pattern having features for completing the planar circuit; (b) using the photo lithographic mask set to expose at least part of a substrate; (c) processing the exposed substrate to fabricate the planar circuit; (d) analyzing the fabricated planar circuit; and (e) determining an optimized planar circuit in dependence upon the analysis.

In accordance with another aspect of the instant invention there is provided a planar circuit fabricated from a photo lithographic mask set comprising: a substrate; a first pattern formed on a layer of the substrate, the first pattern including features for forming part of a planar circuit; and a second pattern formed on the layer of the substrate, the second pattern disposed within the first pattern and including features for completing the planar circuit, wherein the second pattern includes at least one modificator section selected for optimizing the planar circuit.

In accordance with another aspect of the instant invention there is provided a planar lightwave circuit comprising: a substrate; a plurality of waveguides arranged on the substrate; and a distinct region on the substrate wherein at least a portion of the plurality of waveguides therein are modified relative to the plurality of waveguides outside the distinct region, the modifications including at least one of an expanded wave guide width of a wave guide, a gap within a wave guide and a lateral offset between a section of a wave guide within the distinct region and a section of the wave guide outside the distinct region.

BRIEF DESCRIPTION OF THE DRAWINGS

Further features and advantages of the present invention will become apparent from the following detailed description, taken in combination with the appended drawings, in which:

FIG. 14A shows the transmission spectra of AWGs fabricated with a master mask and a reference slave mask; and FIG. 14B shows the transmission spectra of AWGs fabricated with a master mask and a corrected slave mask.

It will be noted that throughout the appended drawings, like features are identified by like reference numerals.

DETAILED DESCRIPTION OF THE PREFERRED EMBODIMENT

Figure 1:
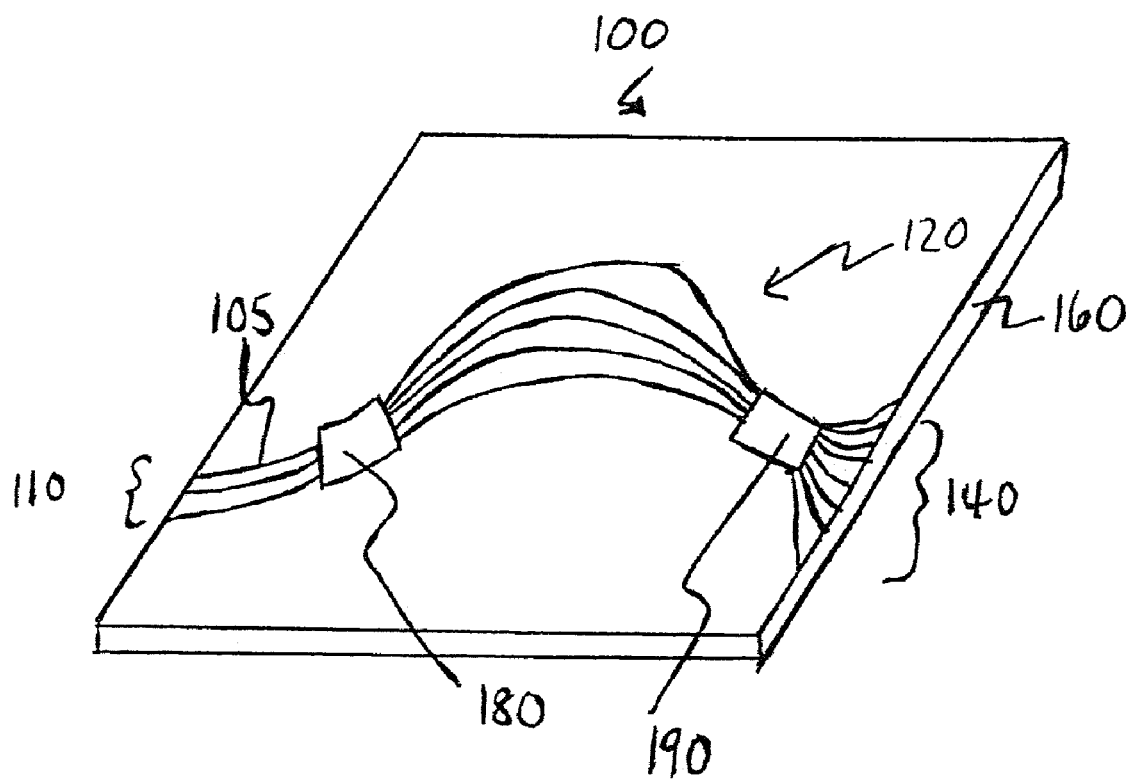
FIG. 1 is a schematic illustration of a prior art AWG.

Referring to FIG. 1, there is shown a schematic diagram of a PLC including an arrayed wave guide grating (AWG). The AWG 100 includes a series of input waveguides 110, an array of curved waveguides 120, and a series of output waveguides 140. Each wave guide is embedded within a common substrate 160. Input 180 and output 190 slab waveguides (e.g., star couplers) couple the input 100 and output 140 series of waveguides, respectively, to the wave guide array 120.

The AWG functions as either a multiplexer or demultiplexer. For example, when functioning as a demultiplexer, the AWG takes a multiplexed light signal transmitted from a single input wave guide 105 and transmits it through the array of curved waveguides 120 such that a plurality of demultiplexed signals are individually output from the series of output waveguides 140.

The ability of an AWG to separate individual channel signals from a multiplexed optical signal is due to the optical path difference between adjacent waveguides in the array 120. In other words, the AWG functions as a generalized interferometer. Accordingly, the lengths and widths of the arrayed waveguides must be accurately calculated, defined, and manufactured in the PLC to provide proper interference.

The complex transmittance, T, of an N-arrayed wave guide is calculated from the sum of the interference paths $$T(\omega) = \sum_{m=0}^{N-1} a_m(\omega) e^{\frac{im\lambda_c \omega}{c}}$$

where $\omega$ denotes the frequency, m corresponds to the grating order, N is the total number of waveguides in the array, $a_m$ is the complex amplitude in the $m^{th}$ wave guide, c refers to the speed of light, and $\lambda_c$ refers to the grating central wavelength.

Knowledge of the amplitude ($a_m$) and phase ($\phi_m$) terms allows the insertion loss (IL), phase response (+), group delay (GD), and chromatic dispersion (CD) to be calculated and plotted as follows:

$$IL(\lambda) = |T(\lambda)|^2$$

$$\phi(\lambda) = \arg(T(\lambda))$$

$$GD(\lambda) = \frac{d\phi(\lambda)}{d\omega}$$

$$CD(\lambda) = \frac{dGD(\lambda)}{d\lambda}$$

Figure 2:
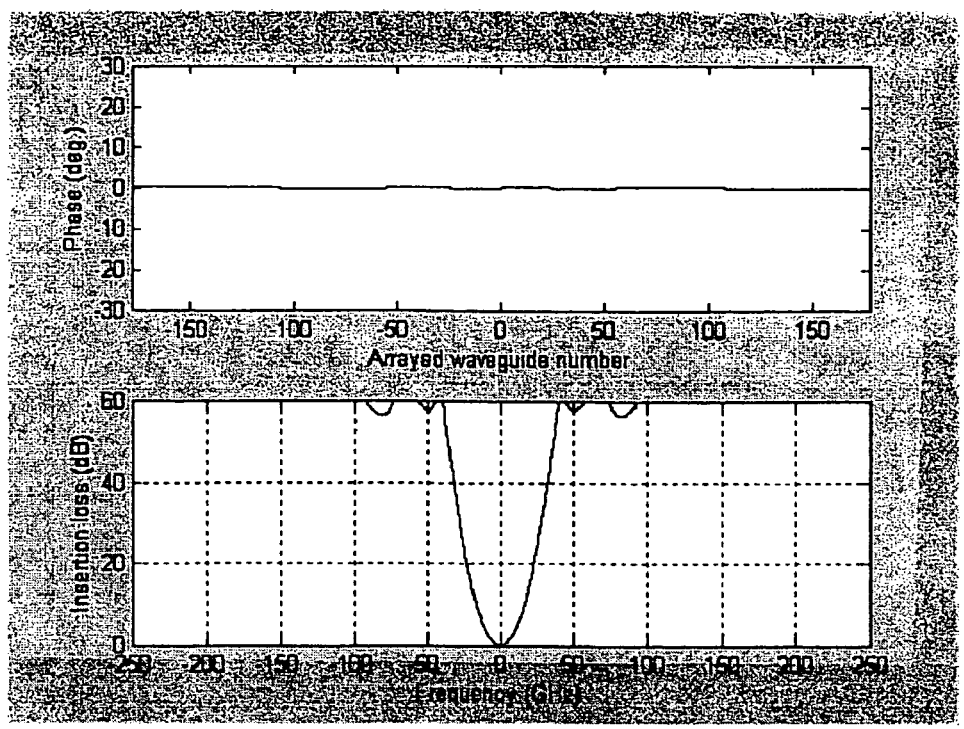
FIG. 2 shows theoretical phase and insertion loss spectra calculated for a 100 GHz Gaussian AWG without phase errors.

FIG. 2 shows theoretical plots calculated with the above equations for a 100 GHz Gaussian AWG The top plot depicts the phase of the interferometer paths and the bottom plot depicts the insertion loss as a function of frequency. As shown in FIG. 2, the narrow band AWG has a Gaussian passband, theoretically zero CD over the 3 DB passband, and very good crosstalk (as evident by very small side lobes).

Unfortunately, waveguides fabricated with conventional photo lithographic techniques exhibit some fabrication errors that lead to variations from the ideal amplitude and phase values. These errors, and in particular those corresponding to phase errors, will lead to crosstalk reduction, passband distortion, and/or a shift in the central wavelength from the designed target.

Some of these fabrication errors arise from process instability, such as the etching process, which introduces variations in the wave guide thickness, width, or refractive index across the chip. These errors are random and unpredictable.

Other errors arise from the mask itself. These so called mask errors are related to the limits of the mask fabrication and its finite resolution. For example, mask errors generally include errors due to the conversion of the ideal wave guide structure made from theoretical bends to the mask format based on simple polygons and the snapping of these polygons to a fixed grid. Similar to the process errors mentioned above, the mask errors are also unpredictable. However, since the mask errors are replicated each time the wafer is exposed through that mask, they produce systematic errors.

Figure 3:
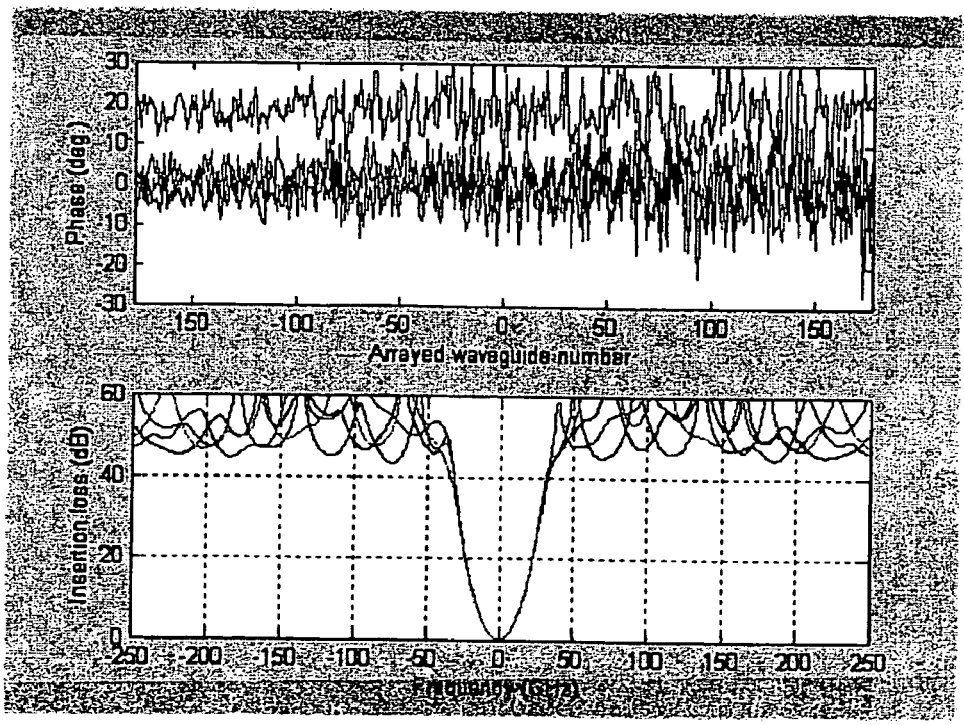
FIG. 3 shows theoretical phase and insertion loss spectra calculated for a 100 GHz Gaussian AWG with phase errors.

Referring to FIG. 3, there is shown theoretical plots calculated with the above equations for a 100 GHz Gaussian AWG wherein various phase errors have been simulated and included in the calculations. The top plot depicts the phase of the interferometer paths, while the bottom plot depicts the insertion loss. Notably, the spectra exhibit defects and/or lobes at unpredictable positions (i.e. are random).

Figure 4:
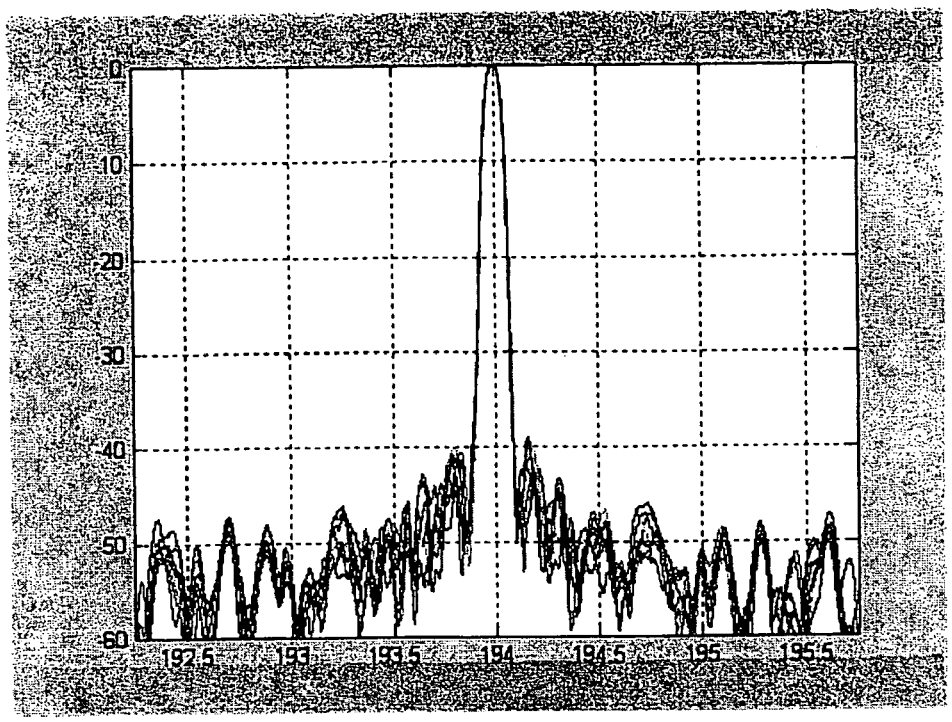
FIG. 4 are experimental spectra of a 100 GHz Gaussian AWG with phase errors.

In contrast, the experimental transmission spectra shown in FIG. 4 exhibit various regular defects and/or side lobes, in addition to some random defects. The transmission spectra shown in FIG. 4 are for various AWGs that were fabricated with the same mask over different positions of a substrate. The systematic lobes are believed to arise from mask related errors while the random lobes are believed to be process related. Notably, the systematic lobes are dominant.

Conventional methods for correcting these errors have typically involved designing a new photo lithographic mask wherein the main errors of the previous mask are compensated for. For example, in one embodiment the new mask iteration involves designing a full new mask wherein the length of each wave guide is modified to reduce phase errors such that the new mask will produce an AWG with a corrected noisefloor. Unfortunately, there is always the risk that the new layout will produce new errors and/or affect other design issues. Furthermore, creating a full new mask is an expensive and time consuming process.

In accordance with the instant invention, these errors are corrected without having to fabricate a full new mask. In particular, they are corrected using an iteration process wherein only a small section of the mask is redesigned and is combined with a larger section that remains constant throughout the various iterations. For exemplary purposes, the smaller section that is redesigned is termed the slave mask or modifier mask, while the larger section that remains constant is termed the master mask. The slave mask and the master mask form a mask set that, according to one embodiment, is used to produce an optimized AWG.

Figure 5:
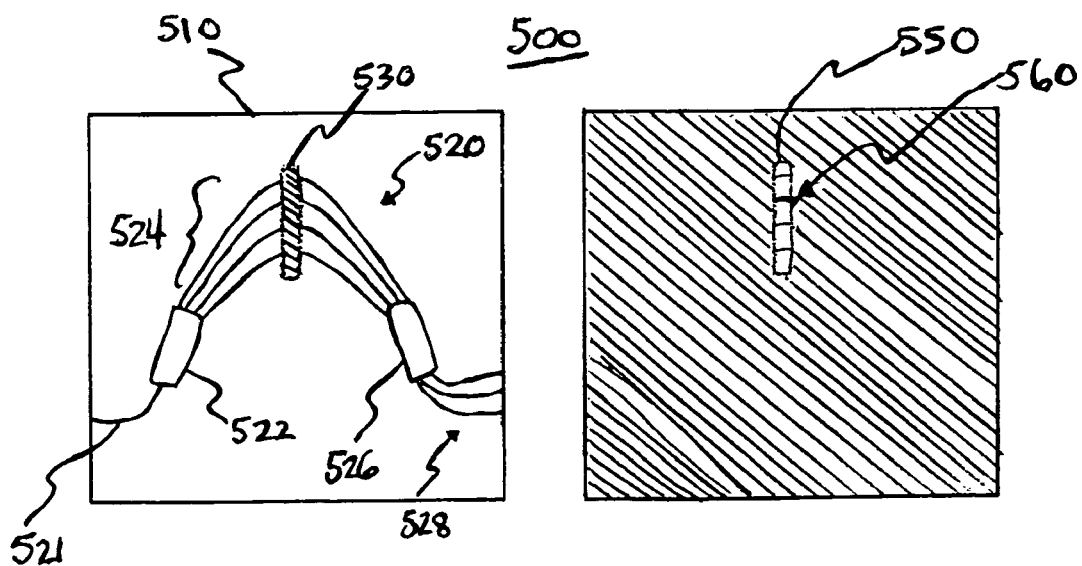
FIG. 5 is a schematic diagram of a photo lithographic mask set in accordance with one embodiment of the instant invention.

Referring to FIG. 5, there is shown a photo lithographic mask set for fabricating an AWG in accordance with an embodiment of the instant invention. The mask set 500 includes a master mask 510 and a slave mask 550, each of which is written on a separate plate. The master mask 510 includes a first pattern 520 for defining the bulk of features for the AWG For example, the pattern 520 corresponding to input wave guide 521, input slab wave guide 522, arrayed waveguides 524, output slab wave guide 526, and output waveguides 528 is clearly evident in FIG. 5. The master mask 510 also includes a featureless region 530 that is depicted as a small rectangular strip bisecting the arc of the arrayed waveguides 524. Typically, the featureless region will be either entirely transparent or entirely opaque, depending on whether the photoresist it is to be used with is a positive or negative photoresist. In the instant embodiment, the featureless region is entirely opaque.

Notably, the featureless region 530 is shown bisecting the array of waveguides 524 for exemplary purposes only. Other positions within the first pattern 520 are also possible. However, designing the master mask 520 such that the featureless region 530 intersects a portion of the AWG wherein a plurality of relatively straight sections of waveguides occur has the advantage that these waveguides are easily modified and/or tailored. Preferably, the featureless region is designed to intersect at least part of the pattern used for forming the AWG such that an incomplete circuit is formed when the master mask is used alone.

The slave mask 550 includes a second pattern 560 that defines the features of the AWG that is not defined by the first pattern 520. In other words, the second pattern 560 includes features that complete the circuit formed by the first pattern 520. For exemplary purposes, the slave mask 550 is shown having dimensions that match the featureless region 530 of the master mask 510. Of course other dimensions are also within the scope of the instant invention. For example, in one embodiment the slave mask and featureless region have different dimensions, but the use of a projection lens reduces the size of one of images such that they substantially match on the substrate. Alternatively, the slave mask and featureless region have different dimensions such that there is an overlap therebetween. Advantageously, designing the slave mask and the featureless region to have the same dimensions and/or such that there is no overlap produces a simpler and more controllable process.

Figure 6:
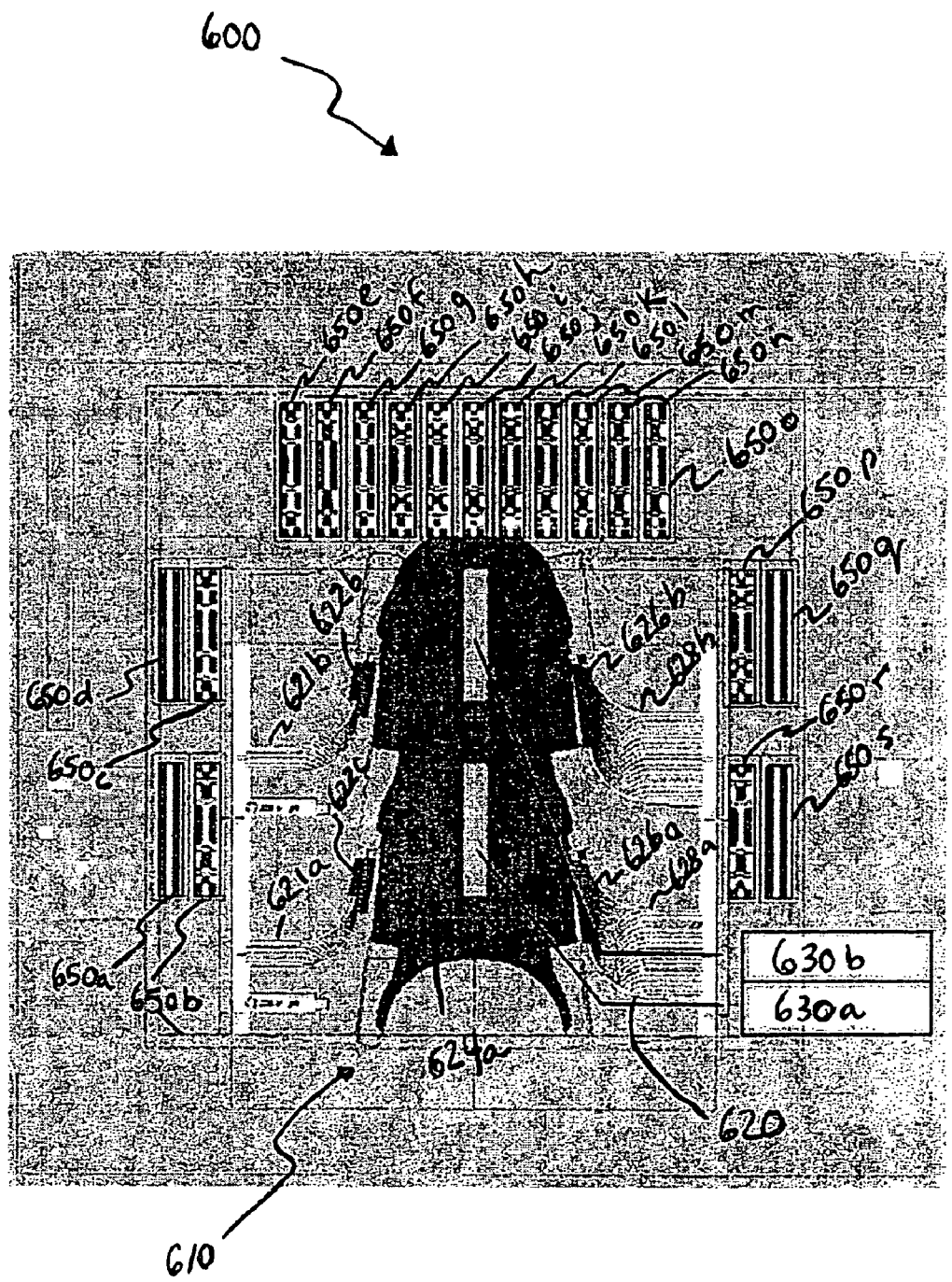
FIG. 6 is a schematic diagram of a photo lithographic mask set in accordance with another embodiment of the instant invention.

Referring to FIG. 6, there is shown a photo lithographic mask set for fabricating an AWG in accordance with another embodiment of the instant invention. The mask set 600 includes a master mask 610 and a plurality of slave masks, all of which are written on a same plate. More specifically, nineteen slave masks 650a-s are written about a periphery of the master mask 610. The master mask 610 includes a first pattern 620 for defining most of the features of two AWGs. For example, the pattern 620 corresponding to first 621a and second 621b input waveguides, first 622a and second 622b input slab waveguides, first 624a and second 624b arrayed waveguides, first 626a and second 626b output slab waveguides, and first 628a and second 628b output waveguides, is clearly evident in FIG. 6. The master mask 610 also includes two featureless regions 630a and 630b, each of which is depicted as a small rectangular strip that bisects a portion of one of the arcs of the arrayed waveguides 624a and 624b, respectively.

Each mask of the plurality of slave masks 650 includes a pattern that defines the features of one or more of the two AWGs that are not defined by the first pattern 620. In other words, each pattern provided by one of the slave masks includes features that will complete at least one of the circuits formed by the first pattern 620. For exemplary purposes, each of the plurality of slave masks 650 is shown having dimensions that match the dimensions of one of the featureless regions 630a and 630b. Of course other dimensions are also within the scope of the instant invention.

Figure 7:
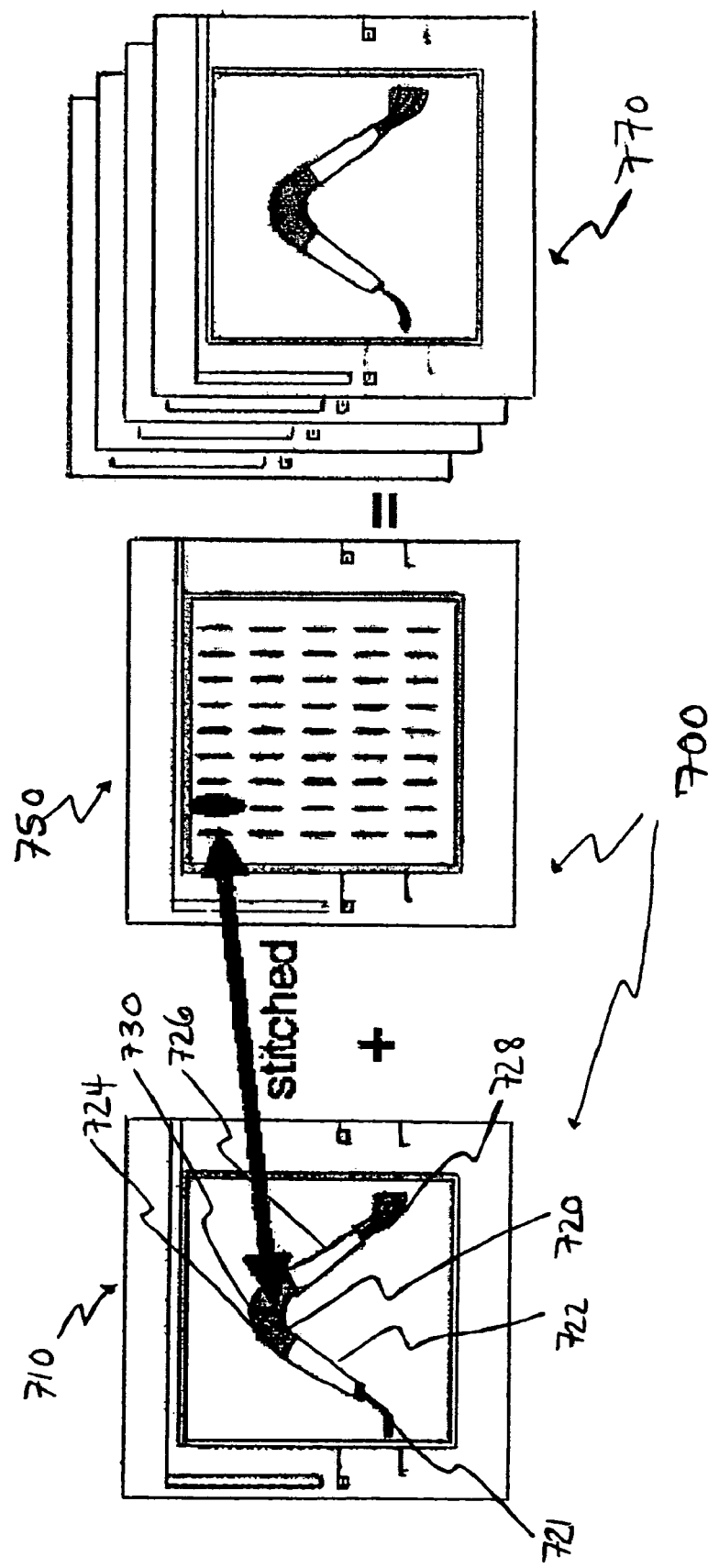
FIG. 7 is a schematic diagram of a photo lithographic mask set in accordance with yet another embodiment of the instant invention.

Referring to FIG. 7, there is shown a photo lithographic mask set for fabricating an AWG in accordance with yet another embodiment of the instant invention. The mask set 700 includes a master mask 710 and a plurality of slave masks 750. The master mask 710 is written on a first plate and includes a first pattern 720 for defining most of the features corresponding to AWG 740. For example, the pattern 720 corresponding to an input wave guide 721, an input slab wave guide 722, the arrayed waveguides 724, an output slab wave guide 726, and an output waveguides 728 is clearly evident in FIG. 7. The master mask 710 also includes a featureless region 730 that is depicted as a small rectangular strip bisecting the arc of the arrayed waveguides 724. Typically, the featureless region will be either entirely transparent or entirely opaque, depending on whether the photoresist it is to be used with is a positive or negative photoresist. In the instant embodiment, the featureless region is entirely opaque.

The plurality of slave masks 750 is written on a separate plate. Each slave mask includes a different pattern that defines the features of the AWG that is not defined by the first pattern 720. In other words, each pattern provided by the plurality of slave masks provides features that complete the circuit formed by the first pattern 720. For exemplary purposes, each of the plurality of slave masks 750 is shown having dimensions that match the featureless region 730 of the master mask 710. Of course other dimensions are also within the scope of the instant invention.

FIG. 7 also shows how stitching the master mask 710 to the plurality of slave masks 750 produces a plurality of complete circuits 770.

Advantageously, each of the slave masks illustrated in FIGS. 5, 6 and 7 occupies a small area so that a large number of them is easily designed on a single plate, thus providing significant cost savings.

In one embodiment, one or more of the slave masks illustrated in FIGS. 5, 6 and 7 is designed to change the effective length of one or more of the waveguides in the AWG relative to the others, and thus is able to modify the phase errors introduced by the master mask. For example, some methods of changing the effective length of the waveguides include providing a widened wave guide section and or introducing variable bends in one of the waveguides. Alternatively, or in addition to, the slave mask(s) is optionally designed such that some of the waveguides have reduced transmission, thus affecting the amplitude of output signals. For example, some methods of providing a loss increase include introducing a gap in the wave guide and/or providing an offset between the end of the section of wave guide provided with the slave mask and the end of the section of wave guide provided by the master mask. Since the slave mask is easily designed to modify any amplitude and/or phase terms of the arrayed wave guide, any tuning and/or optimizing of the AWG, including changing the chromatic dispersion, is feasible.

Figure 8:
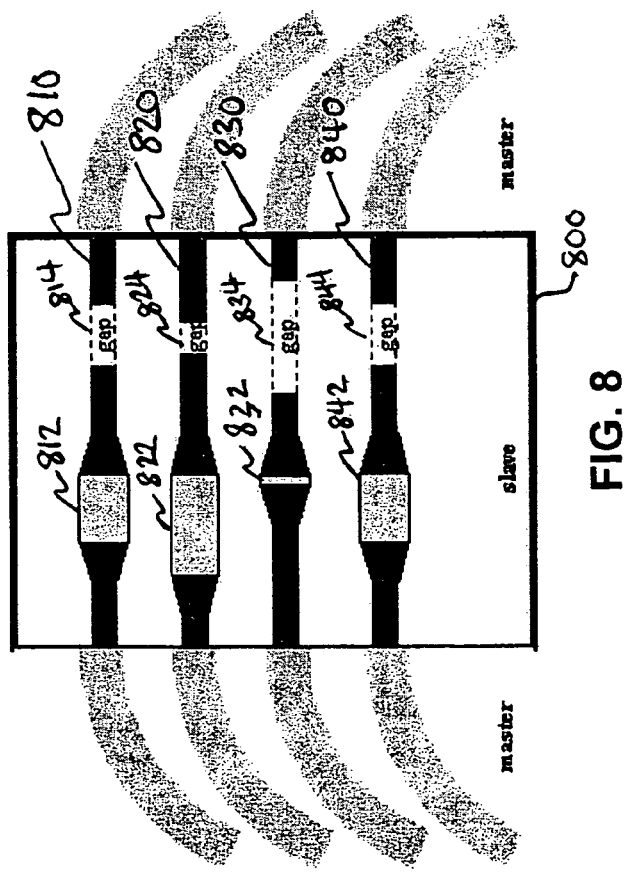
FIG. 8 is a schematic diagram of a slave mask in accordance with one embodiment of the instant invention.

FIG. 8 shows the configuration of a slave mask in accordance with one embodiment of the instant invention. The slave mask 800 includes a pattern that provides features for four waveguides 810, 820, 830, and 840. Each of the four waveguides includes a widened section of wave guide 812, 822, 832, and 842 and a gap 814, 824, 834, and 844. Each widened section and each gap is designed with a different length. Notably, the slave mask is shown relative to a master mask to demonstrate how the slave mask provides a pattern that completes the circuit of the pattern provided by the master mask. For illustrative purposes, the features of the slave mask and master mask are shown as opaque regions, and thus would be used with a negative photoresist. Alternatively, the features of the slave and master mask are designed with transparent regions and is used with a positive photoresist.

Figure 9:
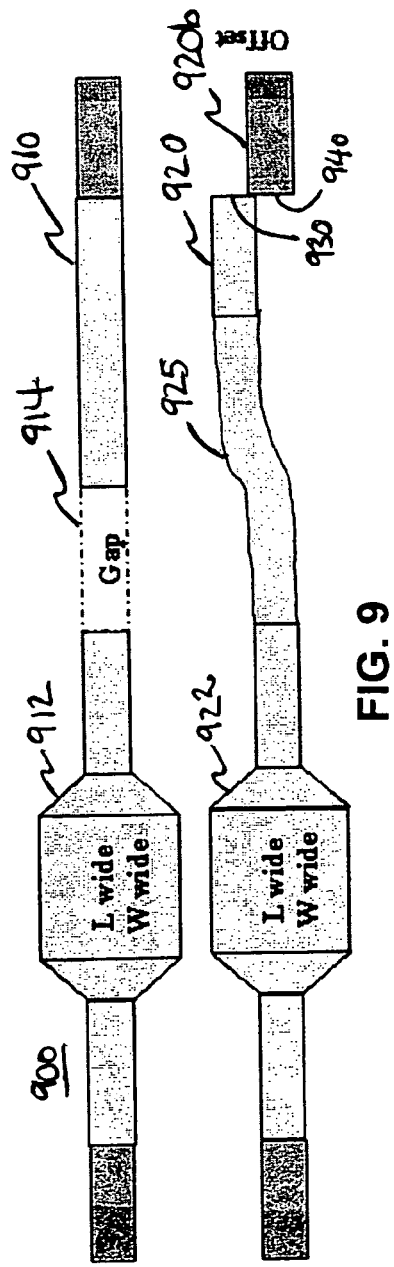
FIG. 9 is a schematic diagram of a slave mask in accordance with another embodiment of the instant invention showing how the combination of the master mask and each slave mask makes a new mask.

A slave mask in accordance with another embodiment of the instant invention is shown in FIG. 9. The slave mask 900 includes a pattern that provides features for two waveguides 910 and 920. Each of the waveguides includes a widened section of wave guide 912 and 922, respectively. In the upper wave guide 920, transmission loss is introduced with a gap 914. In the lower wave guide 920, transmission loss is introduced with an s-bend that shifts the slave mask wave guide 920 by a predetermined amount relative to the corresponding master wave guide 920b. In particular, the s-bend produces an offset between the end 930 of the wave guide formed by the slave mask and the end 940 of the wave guide formed by the master mask. Notably, the slave mask is shown relative to a master mask to demonstrate how the slave mask provides a pattern that completes the circuit of the pattern provided by the master mask. For illustrative purposes, the features of the slave mask and master mask are shown as opaque regions, and thus would be used with a negative photoresist. Alternatively, the features of the slave and master mask are designed with transparent regions and is used with a positive photoresist.

Figure 10:
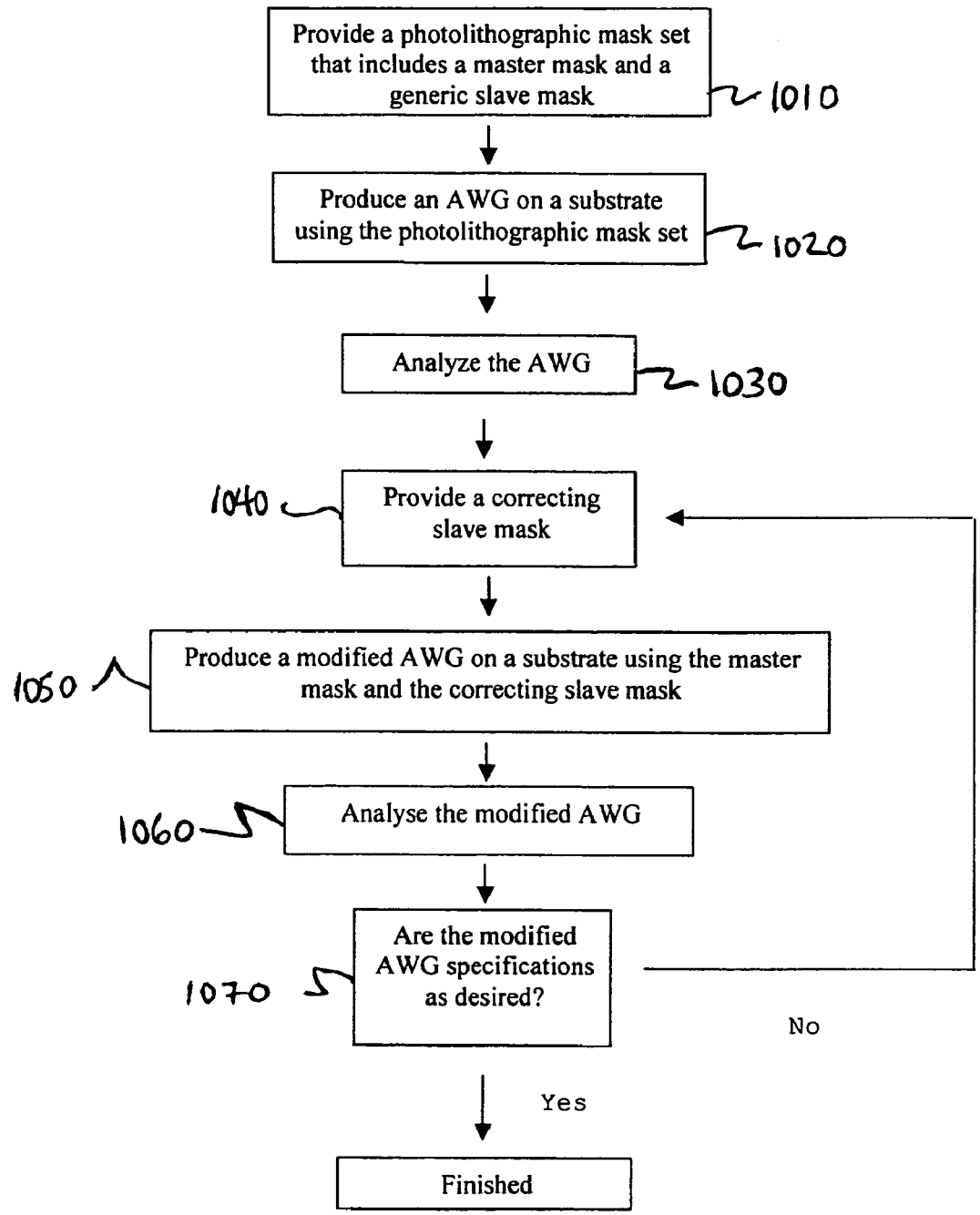
FIG. 10 is schematic diagram of a method of fabricating an AWG in accordance with one embodiment of the instant invention.

Referring to FIG. 10, a method for the fabrication an AWG according to one embodiment of the instant invention is described. The first step 1010 involves generating and/or providing a photo lithographic mask set that includes a master mask and a slave mask. Preferably, the master mask includes a pattern for defining most, but not all, of the features corresponding to an AWG Preferably, the slave mask is a reference slave mask that includes a pattern that corresponds to the features needed to complete the AWG, but that will not introduce any phase or amplitude variation. For example, in one embodiment, the pattern in the reference slave mask includes a plurality of straight waveguides. The second step 1020 is to use the master mask and reference slave mask to produce an AWG on the substrate. The third step 1030 is to analyze and/or measure the optical response of the AWG and to determine any phase and/or amplitude errors. If there are no phase and/or amplitude errors and/or if the optical response is as desired, then the process stops here. If, however, the AWG does not exhibit optimum response the process continues to the fourth step 1040, which is to generate and/or provide one or more new slave masks that do provide phase and/or amplitude variations. The fifth step 1050 is to use the master mask and the new slave mask(s) to produce a modified AWG(s) on the substrate. The sixth step 1060 is to analyze and/or measure the optical response of the modified AWG(s) to determine if it is working and/or functioning as desired. If not, steps four to six are reiterated as needed.

Notably, the second and fifth steps in the above described method involve combining the master and slave masks to form a complete AWG on the substrate. In the preferred embodiment, the master mask and slave mask are combined by stitching. Stitching is a photo lithographic process that is well known in the art, and is not described in further detail. Traditionally, stitching is used to create a pattern that is larger than can be achieved using a single mask, single exposure. In the instant invention, stitching is used to combine a smaller pattern with a larger pattern, wherein the smaller pattern is positioned within the larger pattern. For example, in this embodiment the second step 1020 includes aligning the master mask above the substrate (including a photoresist and a core layer) and exposing the substrate to form a master mask image thereon. Next the reference slave mask is aligned above the master mask image and the substrate is exposed such that the reference slave image is set within the master mask image to form a complete image corresponding to the AWG Subsequently, the substrate is processed, including an etching step, to complete the AWG In an alternative embodiment, the master mask and slave mask are combined in a tandem process. In this embodiment, the second step 1020 involves using the master mask to first expose and etch the substrate, followed by using the reference slave mask to expose and etch the already partially etched substrate. Subsequently, the etched substrate is processed to form the AWG Notably, this method includes an additional etching step, and thus is less desirable.

In yet an alternative embodiment, the master mask and slave mask are combined in a process using a single production mask thus obviating the need for a stitching step. In this embodiment, the fourth step 1040 includes writing the production mask, which includes a slave mask that provides the optimized AWG dropped within the master mask. The fifth step involves using the production mask to expose the substrate, using a single exposure. Subsequently, the substrate is processed, including an etching step, to form the AWG.

In each of the above embodiments, it is preferred that the master mask be combined with the slave mask relatively seamlessly. In other words, it may be difficult to visually distinguish the boundary between the parts of the complete circuit that were formed from the master mask and the parts that were formed by the slave mask. However, in each of the above embodiments the parts of the circuit that were formed from the slave mask will include a modificator section wherein one or more of the waveguides are altered and/or modified. In most instances, as for example shown in FIG. 11, this modificator section will be visually discernable.

Figure 11:
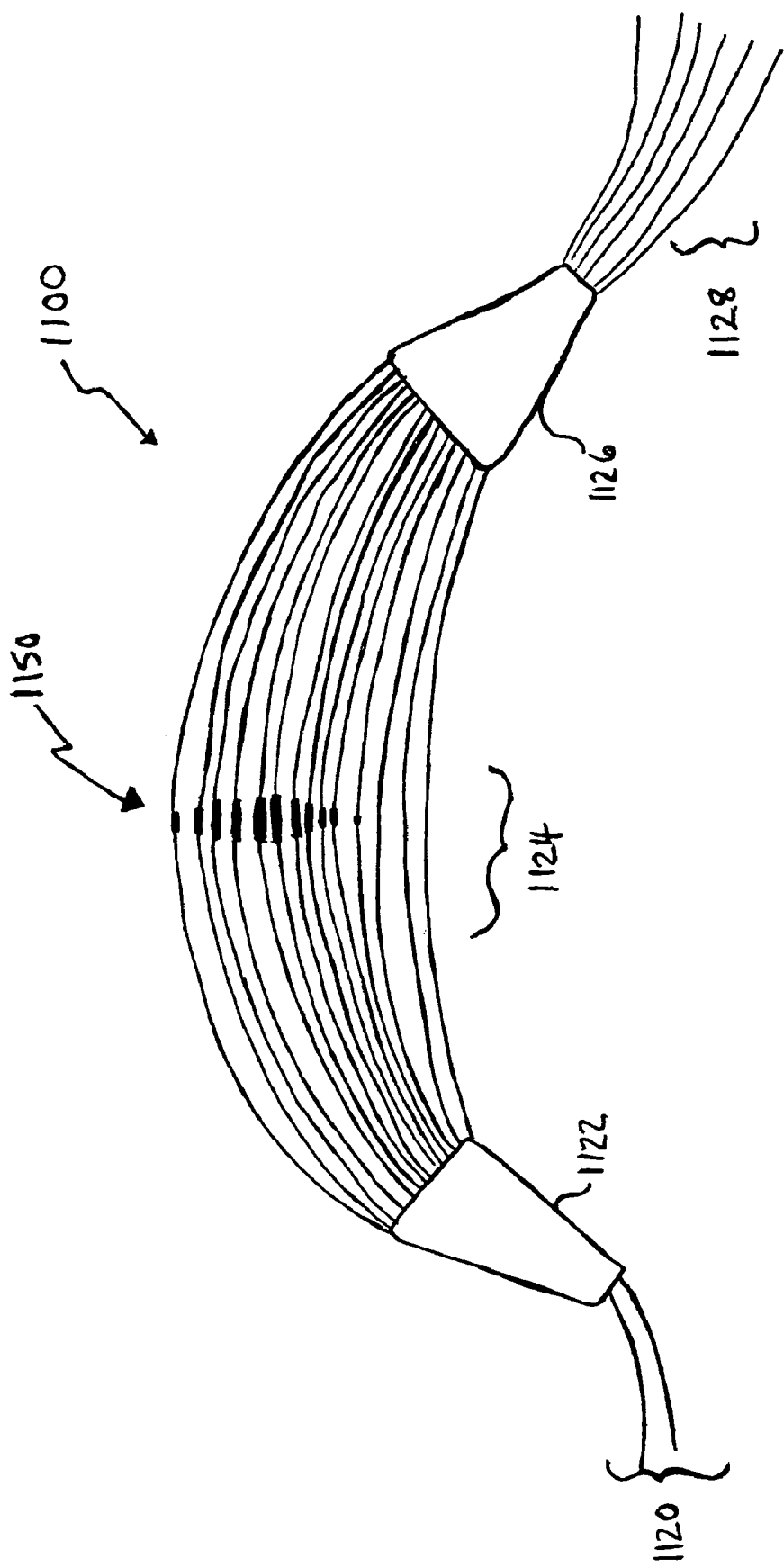
FIG. 11 is a schematic diagram of an AWG fabricated in accordance with one embodiment of the instant invention.

FIG. 11 shows a schematic diagram of an AWG fabricated in accordance with one embodiment of the instant invention. The AWG 1100 includes input waveguides 1120, input slab wave guide 1122, arrayed waveguides 1124, output slab wave guide 1126, and output waveguides 1128. The modificator section 1150 is clearly shown as an approximately elliptical region approximately bisecting the arc of the arrayed waveguides 1124. In this embodiment, the elliptical region is formed from a slave mask that includes a parabolic phase compensation. The actual ellipse shape is evident due to the increasing and decreasing widths of expanded wave guide sections in predetermined waveguides. Of course, other modificator shapes and sizes are also possible.

Figure 12:
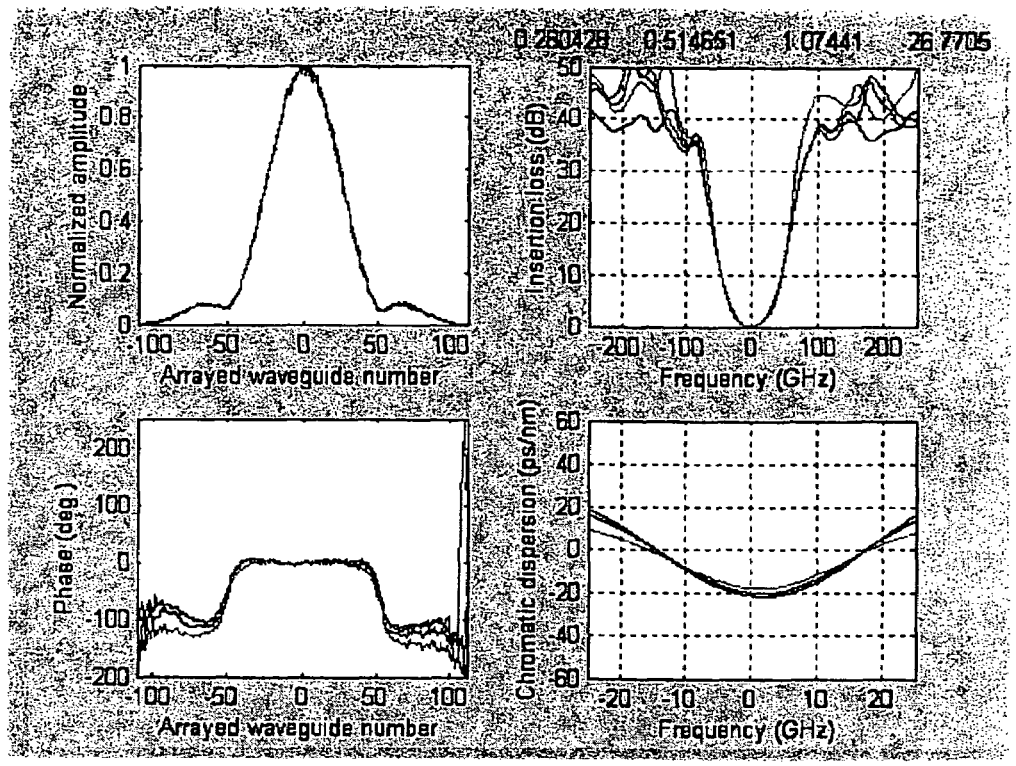
FIG. 12 shows the results of an OLCI analysis on AWGs fabricated with a master mask and a reference slave mask.

Referring to FIG. 12, there is shown various experimental spectra of AWGs fabricated in accordance with the instant invention. In particular, the AWGs were fabricated using a master mask and a reference slave mask and were designed to have a 0.38 nm-1 dB bandwidth and a 1.00 nm-25 dB bandwidth. The phase and amplitude terms were measured using an optical low-coherence interferometer (OLCI). Unfortunately, due to the presence of master and slave mask phase errors, the spectra and chromatic dispersion are degraded and the passband shape exhibits a rounder response than desired. For example, the −1 dB bandwidth is 0.28 nm and the −25 dB bandwidth is 1.07 nm.

Figure 13:
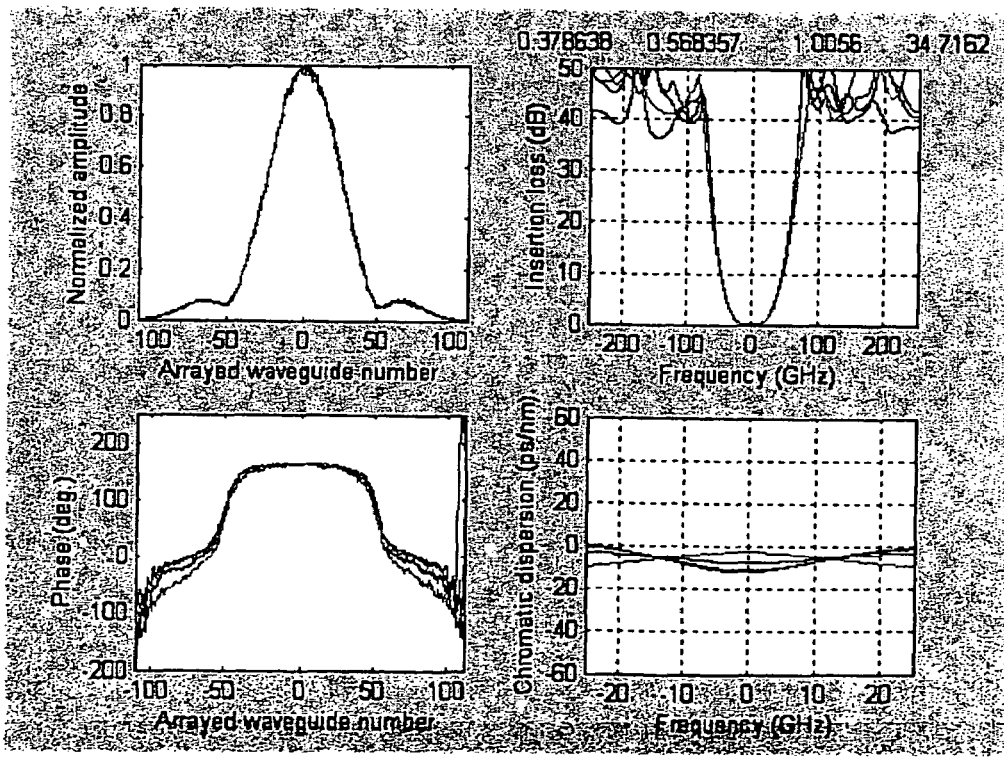
FIG. 13 shows the results of an OLCI analysis on AWGs fabricated with a master mask and a corrected slave mask.

Referring to FIG. 13, there is shown various experimental spectra of AWGs fabricated using a master mask and a slave mask optimized to correct the above errors. In particular, the optimized AWGs were designed to have a 0.38 nm-11 dB bandwidth and a 1.00 nm-25 dB bandwidth. The phase and amplitude terms were measured using an optical low-coherence interferometer (OLCI). As shown in FIG. 13, the use of the optimized slave mask fine-tunes the spectra and chromatic dispersion and produces the expected −1 dB and −25 dB bandwidths. Furthermore, the use of the optimized slave mask also significantly improves the noise floor of the AWG filter. For example, compare the insertion loss spectra shown in FIG. 14a, which were obtained from AWGs fabricated without an optimized slave mask, and the insertion loss spectra shown in FIG. 14b, which were obtained from AWGs fabricated with an optimized slave mask.

The instant invention has been described hereto with reference to AWGs for exemplary purposes only. It is also applicable to other planar lightwave circuits, and/or, in fact any planar circuit.

Advantageously, the instant invention provides an efficient method for optimizing a planar circuit, as for example described above with respect to an AWG Some of the efficiency arises from the small mask size needed for sequential mask iterations. For example, over ten mask iterations can be performed using a mask set that is written on a single plate, as shown for example in FIG. 6. This reduces fabrication costs, time, and materials. In addition, some of the efficiency is due to the fact that the slave mask is designed to correct systematic errors introduced by the master mask and/or tailor the master mask. Since systematic errors introduced by the master mask remain constant throughout sequential iterations, convergence to the optimize design is simpler and quicker.

Furthermore, the instant invention also shows potential for simplifying monolithic integration of multiple components. For example, using a mask set as described FIG. 6, allows each of the individual components (i.e. the two AWGs) provided by the master mask to be tuned. Advantageously, the individual components are tuned in parallel or in tandem.

In addition, the instant invention provides means for accommodating different targets for one or more customers. In this instance, the master mask provides a general template for defining the planar circuit, while a plurality of slave masks is used to tune the planar circuit. For example, with reference to an AWG the plurality of slave masks are used to tune the central wavelength or passband shape in dependence upon the customers specifications.

Advantageously, the instant invention also provides means for correcting errors produced by process instability. For example with reference to a planar lightwave circuit, errors occurring from varying refractive index, wave guide thickness, and/or chromatic dispersion across a substrate are corrected by using different slave masks for different regions on a substrate.

The embodiments of the invention described above are intended to be exemplary only. The scope of the invention is therefore intended to be limited solely by the scope of the appended claims.

What is claimed is:

1. A photolithographic mask set comprising:
   a master mask including a first pattern having features for forming part of a planar lightwave circuit, the first pattern including a featureless region disposed therein such that the planar lightwave circuit is incomplete; and,
   a slave mask including a second pattern having features for completing the planar lightwave circuit.

2. A photo lithographic mask set according to claim 1, wherein the second pattern is designed to correct systematic errors induced by the master mask.

3. A photo lithographic mask set according to claim 1, wherein the second pattern has been experimentally optimized using a plurality of other slave masks.

4. A photo lithographic mask set according to claim 1, wherein a perimeter of the featureless region and a perimeter of the slave mask have a same shape and dimensions.

5. A photo lithographic mask set according to claim 1, wherein the master mask and the slave mask are written on different regions of a same plate.

6. A photo lithographic mask set according to claim 5, wherein the slave mask is written at a periphery of the master mask.

7. A photo lithographic mask set according to claim 1, wherein the master mask and the slave mask are written on different plates.

8. A photo lithographic mask set according to claim 7, comprising a plurality of other slave masks written on the same plate as the slave mask.

9. A photo lithographic mask set according to claim 1, wherein the first pattern is for providing a general layout of the planar lightwave circuit, and wherein the features in the second pattern are for tuning the planar lightwave circuit.

10. A photo lithographic mask set according to claim 1, wherein the slave mask is for providing a modificator section selected for optimizing the planar lightwave circuit.

11. A photo lithographic mask set according to claim 10, wherein the at least one modificator section includes a plurality of waveguides that are modified relative to a corresponding plurality of waveguides outside the modificator section.

12. A photo lithographic mask set according to claim 11, wherein the modifications comprise at least one of an expanded width of a wave guide, a gap within a wave guide and a lateral offset between a section of a wave guide within the modificator section and a section of the wave guide outside the modificator section.

13. A photo lithographic mask set according to claim 12, wherein the planar lightwave circuit comprises an arrayed wave guide grating having a plurality of waveguides of different lengths arranged in an arc on a substrate.

14. A photo lithographic mask set according to claim 13, wherein the at least one modificator section substantially bisects the arc.

15. A method of utilizing a photo lithographic mask set, the method comprising the steps of:
   (a) providing a photo lithographic mask set including a master mask and a slave mask, the master mask including a first pattern having features for forming part of a planar lightwave circuit and including a featureless region disposed within the first pattern such that the planar lightwave circuit is incomplete, the slave mask including a second pattern having features for completing the planar lightwave circuit;
   (b) using the photo lithographic mask set to expose at least part of a substrate;
   (c) processing the exposed substrate to fabricate the planar lightwave circuit;
   (d) analyzing the fabricated planar lightwave circuit; and
   (e) determining an optimized planar lightwave circuit in dependence upon the analysis.

16. A method according to claim 15, comprising the step of fabricating the optimized planar lightwave circuit.

17. A method according to claim 15, wherein step (b) comprises:
   aligning the master mask above the substrate and exposing the substrate through the master mask; and,
   aligning the slave mask above the substrate and exposing the substrate through the slave mask, the slave mask aligned such that features in the second pattern align with corresponding features in the first pattern on the substrate.

18. A method according to claim 15, wherein step (d) comprises measuring at least one of phase and amplitude errors of the fabricated planar lightwave circuit.

19. A method according to claim 18, wherein step (d) further comprises using the at least one measured error to design at least one correcting slave mask.

20. A method according to claim 19, wherein step (d) further comprises repeating steps (b) though (d) for the at least one correcting slave mask.

21. A method according to claim 19, comprising the step of writing a production mask from data from the master mask and the at least one correcting slave mask.

22. A method according to claim 15, wherein step (e) comprises calculating a desired modification to the slave mask to modify a property of the planar lightwave circuit.

23. A method according to claim 15, wherein step (b) comprises stitching the slave mask to the master mask about a periphery of the featureless region.

24. A method according to claim 15, wherein step (b) comprises the step of exposing a resist layer formed on an optical core layer.

* * * * *